(12) United States Patent
Hieda et al.

(10) Patent No.: US 7,235,921 B2
(45) Date of Patent: Jun. 26, 2007

(54) ORGANIC ELECTROLUMINESCENT ELEMENT WITH PARTICULAR ELECTRODE TERMINAL STRUCTURE

(75) Inventors: Masato Hieda, Kariya (JP); Kentaro Yamashita, Kariya (JP); Masayuki Harada, Kariya (JP); Hironori Ito, Kariya (JP); Yoshifumi Kato, Kariya (JP)

(73) Assignee: Kabushiki Kaisha Toyota Jiboshokki, Kariya-shi (JP)

( * ) Notice: Subject to any disclaimer, the term of this patent is extended or adjusted under 35 U.S.C. 154(b) by 350 days.

(21) Appl. No.: 10/926,678

(22) Filed: Aug. 25, 2004

(65) Prior Publication Data

US 2005/0077818 A1    Apr. 14, 2005

(30) Foreign Application Priority Data

Aug. 29, 2003  (JP) .............................. 2003-307259
Dec. 4, 2003   (JP) .............................. 2003-406455

(51) Int. Cl.
*H01J 1/62*    (2006.01)
*H01J 63/04*   (2006.01)

(52) U.S. Cl. ....................................... 313/504; 313/506
(58) Field of Classification Search ................ 313/498, 313/504, 506, 512; 315/169.3
See application file for complete search history.

(56) References Cited

U.S. PATENT DOCUMENTS 5,970,318 A * 10/1999 Choi et al. .................... 438/99
6,787,992 B2 *  9/2004 Chuman et al. ............. 313/505
6,833,667 B2 * 12/2004 Hamano et al. ............. 313/504
2003/0071563 A1 *  4/2003 Hamada et al. ............. 313/500
2004/0125052 A1 *  7/2004 Sakamoto et al. ............ 345/76
2004/0251825 A1 * 12/2004 Kato et al. ................... 313/506

FOREIGN PATENT DOCUMENTS

JP           07-211459              8/1995
JP           07211459 A    *        8/1995
JP           2001085158 A  *        3/2001

* cited by examiner

*Primary Examiner*—Nimeshkumar D. Patel
*Assistant Examiner*—Kevin Quarterman
(74) *Attorney, Agent, or Firm*—Morgan & Finnegan, L.L.P.

(57) ABSTRACT

An organic electroluminescent element has a first electrode, a second electrode and an organic electroluminescent layer. The first electrode has a first luminescent region and a first terminal extending from the first luminescent region. The second electrode has a second luminescent region and a second terminal extending from the second luminescent region. The first electrode is made of a material having a higher volume resistivity than the second electrode. The organic electroluminescent layer is interposed between the first electrode and the second electrode. The first luminescent region and the second luminescent region respectively contact the organic electroluminescent layer. A length of a boundary between the first luminescent region and the first terminal is greater than a length of a boundary between the second luminescent region and the second terminal.

13 Claims, 8 Drawing Sheets

ORGANIC ELECTROLUMINESCENT ELEMENT WITH PARTICULAR ELECTRODE TERMINAL STRUCTURE

BACKGROUND OF THE INVENTION

The present invention relates to an organic electroluminescent element.

An organic electroluminescent element (or an organic EL element) includes an anode, an organic electroluminescent layer (or an organic EL layer) and a cathode, and these are layered and generally formed on a substrate. A component on a light output side relative to the organic EL layer has a transparency (to be transparent) against light outputting outside the organic EL element. The organic EL element emits light due to electric current flowing through the organic EL layer as electric voltage is applied between the anode and the cathode.

Such an organic EL element should reduce its volume and area occupied by the element and the wiring connected to the element, since the size of a device (for example, a portable terminal and the like) to which the element is assembled is limited. The organic EL element also should increase its efficient display region (light-emitting area) for the same volume and area. Furthermore, the organic EL element should simplify connections between the organic EL element and an external drive circuit for driving the element so as to simplify manufacturing.

For the above requirements, an anode terminal and a cathode terminal were conventionally arranged on one side of the organic EL element, as disclosed in columns [0005], [0006], [0009], and FIGS. 1 and 3 of Unexamined Japanese Patent Publication No. 7-211459. Such organic EL element will now be described with reference to FIGS. 7A and 7B.

The above conventional organic EL element 21 partially includes a transparent electrode (anode) 23 made of indium tin oxide ("ITO") formed on a substrate (transparent substrate) 22 having an extended portion 221. A collector 24 is formed on the transparent electrode 23 so as to double as an externally leading terminal (anode terminal) 25 in a state where it extends toward the extended portion 221 of the substrate 22. A luminescent layer (organic EL layer) 26 and a reflective insulating layer (not shown) are sequentially formed on the transparent electrode 23 and the collector 24 (except for the externally leading terminal 25). A backside electrode (cathode) 27 is formed on the luminescent layer 26 and the reflective insulating layer. The backside electrode 27 is formed to extend toward the extended portion 221 of the substrate 22 so as to partially double as an externally leading terminal (cathode terminal) 25'.

Such an organic EL element 21 is reduced in size by the width of A in FIG. 8, that is, the width of one terminal, in comparison to a structure in which terminals of respective electrodes are provided on opposite sides of the rectangular organic EL element 21 as shown in FIG. 8.

In comparison to the organic EL element 21 shown in FIG. 8, the substrate having the same size allows a larger-size (area) organic EL layer to be arranged thereon. Specifically, even a region where the terminal 25' is arranged may be used as an efficient display region, that is, may be provided with an organic EL layer.

Furthermore, since the externally leading terminals are provided at one side of the organic EL element 21 in FIG. 7B, which is different from that of the organic EL element 21 of FIG. 8, wiring work is performed only on one side of the organic EL element 21. Accordingly, it is possible that a connector and the like is provided for connecting the anode terminal 25 with the cathode terminal 25' shown in FIG. 7B and only plugged to these terminals to finish the wiring work. Additionally, area and volume occupied by wiring in a portable terminal between an external drive circuit and the organic EL element 21 may be smaller than the element 21 of FIG. 8.

However, as the terminals are arranged at one side of the luminescent region, there occurs a problem that the intensity of electric current flowing at each spot of the organic EL layer is relatively large on a side near the terminals and relatively small on a side far from the terminals. This problem occurs because at least one of the anode and cathode increases its volume resistivity to a measurable extent.

As described above, the organic EL element needs to output light from at least one side relative to the organic EL layer. Accordingly, the electrode on the light output side should have a transparency against the above output light and should also have a characteristic of not degrading the organic EL layer, which thereby limits materials to be employed. Therefore, generally, the electrode on the light output side should be made of a material having a high volume resistivity in comparison to the electrode on the other side.

For the above reasons, a path leading to a cathode luminescent region through the organic EL layer adjacent to the anode terminal has a smaller resistance value, while a path leading to a cathode luminescent region remote from the anode terminal has a larger resistance value. In other words, electric current flowing at each spot of the organic EL layer decreases as it distances from the anode terminal. Therefore, there have been the following problems.

Generation of Unevenness in Brightness

Since the organic EL element has a portion of relatively large electric current flow and a portion of relatively small electric current flow, unevenness in brightness is generated in the element as a whole. As the electric current flow increases, the brightness of the organic EL element rises. Therefore, as the organic EL element has a portion of relatively large electric current flow and a portion of relatively small electric current flow, brightness differential arises in the element between the above portions, which generates unevenness in brightness.

Generation of Life differential in the Element

The life of the element varies between the portion of relatively large electric current flow and the portion of relatively small electric current flow. Generally, the life shortens at the portion of relatively large electric current flow. In comparison to an organic EL element having uniform electric current flow, this organic EL element has a portion having a relatively short life, which shortens the life thereof. Additionally, when the element is used for a long period, there arises a portion not emitting light or a lower brightness portion than the other portions.

Problems such as Degradation

Since the organic EL element has a portion of relatively large electric current flow and a portion of small electric current flow, there may occur degradation by location.

Generation of Unevenness in Chromaticity

Since the organic EL element has a portion of relatively large electric current flow and a portion of small electric current flow, it causes S-S annihilation phenomenon in the organic EL element including a fluorescent material and also causes T-T annihilation phenomenon in the organic EL element including a phosphorescent material. Accordingly, in an organic EL element containing a plurality of luminescent materials in the luminescent layer for emitting colors of different wavelengths from at least one other luminescent material, brightness of each layer may differ between a portion of relatively smooth electric current flow and a portion of relatively unsmooth electric current flow, with a consequence of possible generation of unevenness in chromaticity.

Accordingly, when the terminals are merely provided on one side of the display area, the above mentioned problems occur, so that it has been difficult to actually use the above structure as an organic EL element. Therefore, there is a need for providing an organic EL element having terminals on one side of respective luminescent regions and small differential in intensity of electric current flowing at each spot of the organic EL layer. Also, when the above organic EL element is provided, the inventors of the present application found appropriate correlation between the terminals and the luminescent regions for reducing differential in intensity of electric current flowing at each spot of the organic EL layer.

SUMMARY OF THE INVENTION

In accordance with the present invention, an organic electroluminescent element has a first electrode, a second electrode and an organic electroluminescent layer. The first electrode has a first luminescent region and a first terminal extending from the first luminescent region. The second electrode has a second luminescent region and a second terminal extending from the second luminescent region. The first electrode is made of a material having a higher volume resistivity than the second electrode. The organic electroluminescent layer is interposed between the first electrode and the second electrode. The first luminescent region and the second luminescent region respectively contact the organic electroluminescent layer. A length of a boundary between the first luminescent region and the first terminal is greater than a length of a boundary between the second luminescent region and the second terminal.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention together with objects and advantages thereof, may best be understood by reference to the following description of the presently preferred embodiments together with the accompanying drawings in which:

DETAILED DESCRIPTION OF THE PREFERRED EMBODIMENTS

Figure 1:
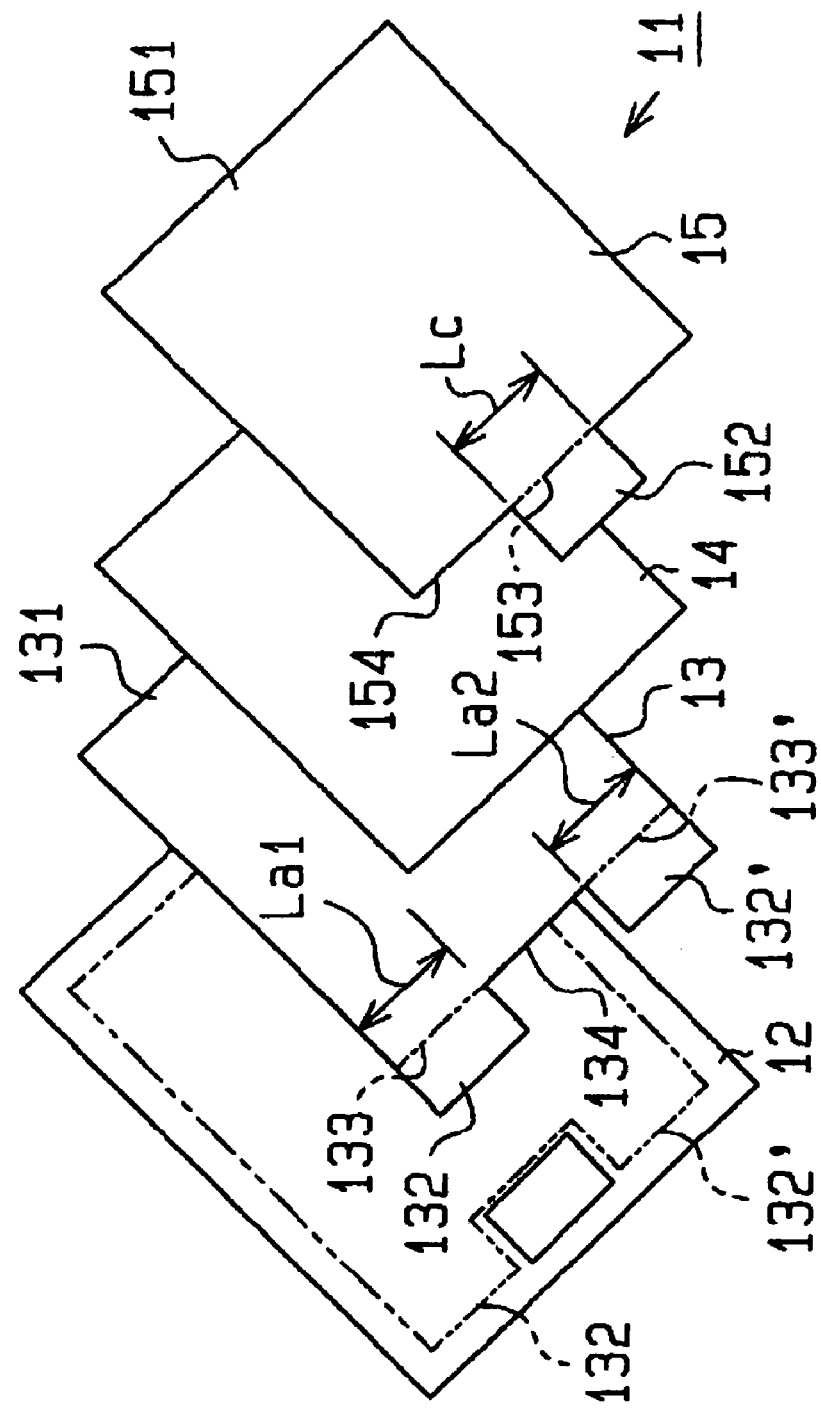
FIG. 1 is a schematically exploded perspective view of an organic electroluminescent element or an organic EL element according to a preferred embodiment of the present invention.

A first organic electroluminescent element (or a first organic EL element) 11 according to a preferred embodiment of the present invention will now be described with reference to FIGS. 1 and 2. FIG. 1 is a schematically exploded perspective view of the organic EL element 11, and FIG. 2 is a schematic cross-sectional view of the organic EL element 11.

[First Organic Electroluminescent Element 11]

Figure 2:
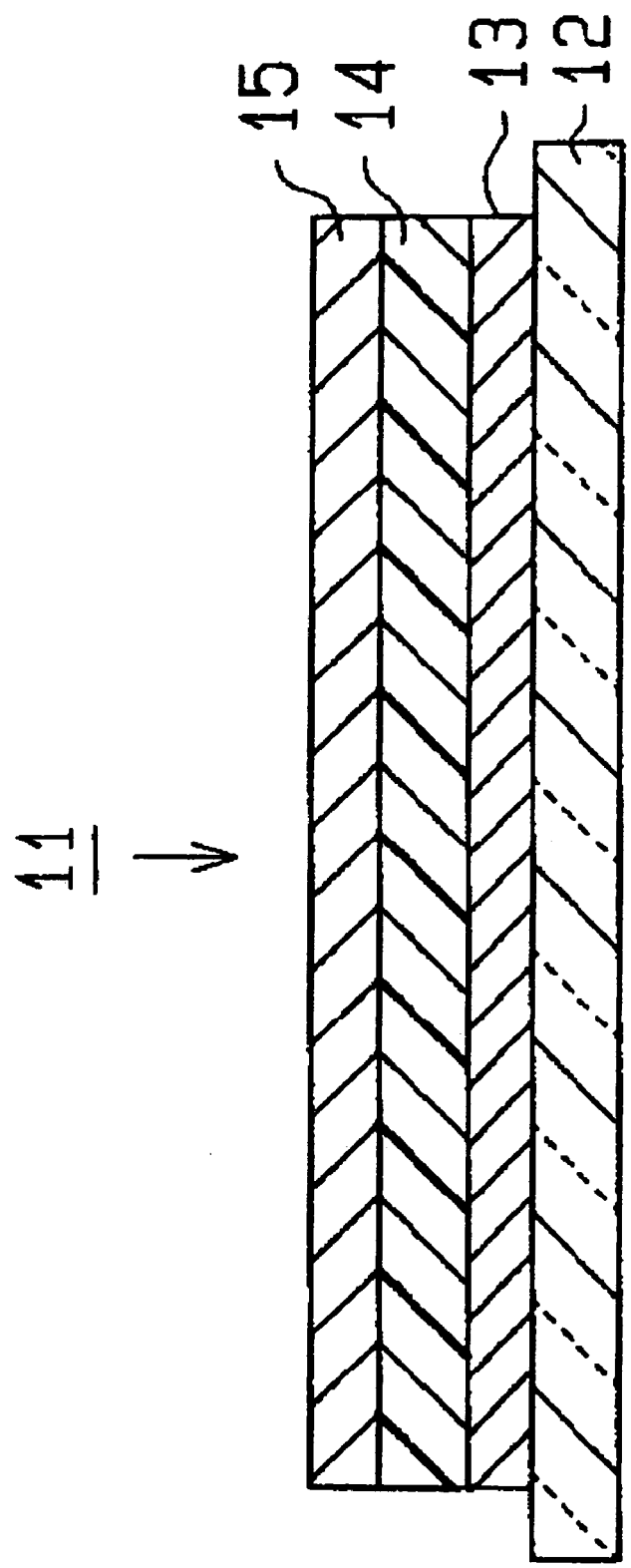
FIG. 2 is a schematically cross-sectional view of the organic EL element according to a preferred embodiment of the present invention.

As shown in FIGS. 1 and 2, the organic EL element 11 alternately layers therein an anode or a first electrode 13, an organic electroluminescent layer or an organic EL layer 14, and a cathode or a second electrode 15, and is formed on one surface of a substrate 12 to be generally an organic electroluminescent device or an organic EL device. The anode 13 (at least an anode luminescent region or a first luminescent region 131) is made of a material having a higher volume resistivity than that of the cathode (at least a cathode luminescent region or a second luminescent region 151). The respective components will now be described.

((Substrate 12))

The substrate 12 is substantially a plate-like member for supporting the organic EL element 11. Since each component layer is extremely thin, the organic EL element 11 is generally manufactured as an organic EL device so as to be supported on the substrate 12. The substrate 12 is preferably planar and smooth because the organic EL element 11 is layered thereon. Additionally, the substrate 12 is transparent against the output light when located on the output light side from the organic EL layer 14.

It is noted that "transparent" in the preferred embodiment means to have transparency against light outputting outside from the organic EL element 11. Generally, "transparent member" in the preferred embodiment has a transparency of 50% or above against the above light, and preferably has 70% or above.

The substrate 12 may employ a known material that has the above characteristics. Generally, a ceramic substrate, such as glass substrate, silicon substrate and quartz substrate, and a plastic substrate are selected. A metallic substrate and a substrate forming a metallic foil on its support body are also employed. Furthermore, a plurality of same or different kinds of substrates may be combined to form a combined sheet and employed as a substrate.

((Anode 13))

The anode 13 is an electrode for injecting a positive hole into the organic EL layer 14, and includes the anode luminescent region 131 and an anode terminal or a first terminal 132, as shown in FIG. 1. The anode luminescent region 131 is rectangular in shape and contacts with the organic EL layer 14. During operation, a positive hole is transported from an external drive circuit connected to the anode terminal 132 to the anode luminescent region 131, and the anode luminescent region 131 injects the positive hole into the organic EL layer 14. The anode terminal 132 is integrally formed with the anode luminescent region 131 and protrudes outside from one side of the anode luminescent region 131, as shown in FIG. 1. That is, the anode terminal 132 is electrically and directly connected to the anode luminescent region 131 at the boundary 133 therebetween.

In a preferred embodiment, as shown in FIG. 1, two anode terminals 132, 132' are provided on one side of the anode luminescent region 131. The anode terminals 132, 132' are provided on respective ends of the side of the anode luminescent region 131 and each have substantially the same shape. That is, the length La1 of the boundary 133 between the anode terminal 132 and the anode luminescent region 131 is substantially equal to the length La2 of the boundary 133' between the anode terminal 132' and the anode luminescent region 131.

During operation, the anode terminals 132, 132' are connected to a terminal of an external drive circuit (not shown) and transports a positive hole which is transported from the external drive circuit. It is noted that the anode terminals 132, 132' are at least partially connected to the terminal of the external drive circuit but need not be connected thereto as a whole.

A material for forming the anode 13 is a material for giving the above characteristics to the anode 13, and generally employs a known material such as a metal, alloy, electrically conductive compound, or a mixture of these materials. The anode 13 is manufactured such that work function of a surface of the anode luminescent region 131 contacting with the organic EL layer 14 is equal to or higher than 4 eV. The material for forming the anode 13, for example, includes metal oxides, metal nitrides, metals, alloys of these metals, alloys of copper iodide, and conductive polymers. The metal oxides and the metal nitrides include indium tin oxide ("ITO"), indium zinc oxide ("IZO"), tin oxide, zinc oxide, zinc aluminum oxide, titanium nitride and the like. The metals include gold, platinum, silver, copper, aluminum, nickel, cobalt, lead, chromium, molybdenum, tungsten, tantalum, niobium and the like. The conductive polymers include polyaniline, polythiophene, polypyrrole, polyphenylenevinylene, poly(3-methylthiophene), polyphenylene sulfide, and the like.

The anode 13 generally has a transparency of 10% or above against output light when located on the light output side from the organic EL layer 14. When light in the visible light range is outputted, ITO having a high transparency in the visible light range is preferably employed. When the anode 13 is employed as a reflecting electrode, a material in the above materials additionally having a property for reflecting output light is appropriately selected. Generally, metals, alloys and metallic compounds are selected.

The anode 13 may be made of only one of the above materials or may be made of a mixture of a plurality of the above materials. Also, a multi-layer structure may be constituted of a plurality of layers having the same compositions or different compositions.

When the anode 13 has a high resistance, the resistance may be lowered by providing a sub-electrode. The sub-electrode is formed by providing on a portion of the anode 13 a metal, such as copper, chromium, aluminum, titanium and aluminum alloy, or these metals layered.

The thickness of the anode 13, especially the anode luminescent region 131, depends upon the employed material, however, it is generally selected from about 5 nm to about 1 μm, preferably from about 10 nm to about 1 μm, more preferably from about 10 nm to about 100 nm, most preferably from about 10 nm to about 300 nm, and the best from about 10 nm to about 200 nm.

The anode 13 is formed by a known thin-film deposition process, such as sputtering, ion plating, vacuum deposition, spin coat and electron beam deposition employing the above mentioned materials. The surface may be treated with UV ozone cleaning or plasma cleaning.

In order to control short circuits and defects in the organic EL element, selecting a fine particle diameter or polishing the film after film deposition serves to control roughness of the surface to 20 nm or below as root-mean-square value.

((Organic EL Layer 14))

The organic EL layer 14 is made of a known organic EL element having a known layer structure and a known material layer and manufactured by a known manufacturing process. That is, it is sufficient for the organic EL layer 14 to exercise the following functions. The organic EL layer 14 may be a multi-layered structure, each layer having any of the following functions, or may be a single layer having the following functions.

Electron Injectable Function

This function is to inject an electron from an electrode (cathode). (Electron injectable property)

Positive Hole Injectable Function

This function is to inject a positive hole from an electrode (anode).

(Positive Hole Injectable Property)

Carrier Transportable Function

This function is to transport electrons and/or positive holes. (Carrier transportable property) A function to transport an electron is called an electron transportable function (Electron transportable property), and a function to transport a positive hole is called a positive hole transportable function (positive hole transportable property).

Luminescent Function

This function is to recombine an injected/transported electron and a carrier to generate excitation (to be an excited state) and to emit light when returning to a ground state.

Accordingly, a region (luminescent region) in the organic EL layer 14 between a surface contacting with the anode luminescent region 131 and a surface contacting with the cathode luminescent region 151 emits light by the above mentioned functions. This light-emitting region is an efficient display region. Generally, the organic EL layer 14 is formed on the surface of the anode luminescent region 131 with substantially the same size and the same shape as the anode luminescent region 131. In a preferred embodiment, the organic EL layer 14 having the same size and the same shape (rectangle) as the anode luminescent region 131 is formed on the anode luminescent region 131.

The organic EL layer 14 may be formed by layering a positive hole transporting layer, a luminescent layer and an electron-transporting layer from the side of the anode 13.

The positive hole-transporting layer transports a positive hole from the anode 13 to the luminescent layer. A material for forming the positive hole-transporting layer includes a low-molecular material, a polymeric material, a polythiophene oligomeric material and an existing positive hole transporting material. Suitable low-molecular materials include metal phthalocyanine series, such as copper phthalocyanine and tetra(t-butyl) copper phthalocyanine, nonmetal phthalocyanine series, quinacridone compound, aromatic amine, such as 1,1-bis(4-di-p-trylaminophenyl)cyclohexane, N,N'-diphenyl-N,N'-bis(3-methylphenyl)-1,1'-biphenyl-4,4'-diamine, N,N'-di(1-naphthyl)-N,N'-diphenyl-1,1'-biphenyl-4,4'-diamine and the like. Suitable polymeric materials include polythiophene, polyaniline, and the like.

The luminescent layer achieves an excited state by recombining a positive hole transported from the anode 13 with an electron transported from the cathode 15, and emits light when returning from the excited state to a ground state. A material for the luminescent layer includes a fluorescent material, a phosphorescent material and the like. Additionally, a host material may contain a dopant (fluorescent material or phosphorescent material).

A material for forming the luminescent layer includes a low-molecular material, a polymeric material and other existing luminescent materials. Suitable low-molecular materials include 9,10-diarylanthracene derivative, pyrene derivative, coronene derivative, perylene derivative, rubrene derivative, 1,1,4,4-tetraphenylbutadiene, tris(8-quinolinolate) aluminum complex, tris(4-methyl-8-quinolinolate) aluminum complex, bis(8-quinolinolate) zinc complex, tris(4-methyl-5-trifluoromethyl-8-quinolinolate) aluminum complex, tris(4-methyl-5-cyano-8-quinolinolate) aluminum complex, bis(2-methyl-5-trifluoromehtyl-8-quinolinolate)[4-(4-cyanophenyl)phenolate] aluminum complex, bis(2-methyl-5-cyano-8-quinolinolate) [4-(4-cyanophenyl)phenolate] aluminum complex, tris(8-quinolinolate) scandium complex, bis[8-(para-tosyl)aminoquinoline] zinc complex, cadmium complex, 1,2,3,4-tetraphenylcyclopentanediene, pentaphenylcyclopentanediene, poly-2,5-diheptyloxy-paraphenylenevinylene, coumarin series fluorescent substance, perylene series fluorescent substance, pyran series fluorescent substance, anthrone series fluorescent substance, porphyline series fluorescent substance, quinacridone series fluorescent substance, N,N'-dialkyl-substituted quinacridone series fluorescent substance, naphthalimide series fluorescent substance, N,N'-diaryl-substituted pyrrolopyrrole series fluorescent substance and the like. Suitable polymeric materials include polyfluorene, polyparaphenylenevinylene, polythiophene, and the like. A host and a guest (dopant) are appropriately selected from the above materials for employing host/guest type composition.

The electron-transporting layer transports electron from the cathode 15 to the luminescent layer. A material for forming the electron transporting layer, for example, includes 2-(4-biphenylyl)-5-(4-t-butylphenyl)-1,3,4-oxadiazole, 2,5-bis(1-naphtyl)-1,3,4-oxadiazole, oxadiazole derivative, bis(10-hydroxybenz[h]quinolinolate) beryllium complex, triazole compound and the like.

It is noted that a layer which may be employed for a known organic EL layer, such as a buffer layer, positive hole blocking layer, electron injecting layer, or a positive hole injecting layer, may be provided. The above layers may be made of a known material by a known manufacturing process.

((Cathode 15))

As shown in FIG. 1, the cathode 15 includes the cathode luminescent region 151 and a cathode terminal or a second terminal 152, which are integrated with each other.

The cathode luminescent region 151 is provided on the opposite side of the organic EL layer 14 from the anode luminescent region 131, and generally has substantially the same size and the same shape as the organic EL layer 14. In a preferred embodiment, the cathode luminescent region 151 is designed to have the same size and the same rectangular shape as the organic EL layer 14, that is, the anode luminescent region 131. In other words, the cathode luminescent region 151 has a side 154 on an outer periphery thereof, the side 154 corresponding to a side 134 on the outer periphery of the anode luminescent region 131.

Thus, the cathode luminescent region 151 is layered on the opposite surface from the surface contacting the anode luminescent region 131 of the organic EL layer 14. During operation, an electron is transported from the external drive circuit connected to the cathode terminal 152 to the cathode luminescent region 151, and the cathode luminescent region 151 injects the electron into the organic EL layer 14.

The cathode terminal 152 extends outward from the side 154 of the cathode luminescent region 151, the side 154 corresponding to the side 134 from which the anode terminal 132 extends. That is, the cathode terminal 152 extends on the same side as the anode terminal 132 extends in the organic EL element 11.

In a preferred embodiment, one cathode terminal 152 is provided and has the same size and the same shape as the anode terminal 132. Accordingly, the length Lc of the boundary 153 between the cathode terminal 152 and the cathode luminescent region 151 is substantially equal to the length La1 of the boundary 133.

Accordingly, the sum (La1+La2) of the length La2 of the boundary 133' and the length La1 of the boundary 133 between the anode terminals 132, 132' and the anode luminescent region 131 is greater than the length Lc of the boundary 153 between the cathode terminal 152 and the cathode luminescent region 151. La1+La2 is twice as long as Lc according to a preferred embodiment.

As shown in FIG. 1, the cathode terminal 152 is arranged on the substrate 12 when the organic EL element 11 is assembled. Also, the cathode terminal 152 is arranged between the anode terminals 132, 132' so as not to electrically connect therewith. That is, the anode terminals 132, 132' and the cathode terminal 152 are arranged alternately on one side 134 (154) of the luminescent region 131 (151), and the anode terminals 132, 132' are arranged on both ends of the side 134.

During operation, the cathode terminal 152 is connected to the external drive circuit (not shown), and transports an electron, which is transported from the above circuit, to the cathode luminescent region 151. It is noted that the cathode terminal 152 at least partially connects with the terminal of the external drive circuit and need not be connected entirely.

The cathode 15 injects an electron to the organic EL layer 14 (electron transporting layer according to the above layer structure). Metal, alloy, electrically conductive compound and a mixture thereof having work function of less than 4.5 eV, generally 4.0 eV or below and typically 3.7 eV or below are employed as an electrode material.

The above electrode material includes lithium, sodium, magnesium, gold, silver, copper, aluminum, indium, calcium, tin, ruthenium, titanium, manganese, chromium, yttrium, aluminum-calcium alloy, aluminum-lithium alloy, aluminum-magnesium alloy, magnesium-silver alloy, magnesium-indium alloy, lithium-indium alloy, sodium-potassium alloy, a mixture of magnesium and copper, a mixture of aluminum and aluminum oxide and the like. Additionally, the materials for the anode 13 may also be employed.

The cathode 15 generally has a transparency of 10% or above against output light when located on the light output side from the luminescent layer. For example, an electrode which layers a transparent conductive oxide on an ultra thin film of magnesium-silver alloy is employed. In this cathode 15, in order to prevent the luminescent layer from being damaged by plasma when sputtering the conductive oxide, a buffer layer to which copper phthalocyanine is added is provided between the cathode 15 and the organic EL layer 14.

When the cathode 15 is used as a light-reflecting electrode, a material having a property for reflecting output light is appropriately selected from the above materials. Generally, a metal, alloy or metal compound is selected.

The cathode 15 may be formed by only one of the above material, or may be formed by a plurality of materials. For example, when about 5% to about 10% of silver or copper is added to magnesium, oxidation of the cathode 15 is prevented, and adhesiveness of the cathode 15 with the organic EL layer 14 is increased. Additionally, the cathode 15 may be made of a multi-layered structure including a plurality of the same compositions or different compositions. For example, the cathode 15 may be formed as follows.

To prevent oxidation of the cathode 15, a metallic protecting layer having corrosion resistance is formed on a portion of the cathode 15 which does not contact the organic EL layer 14. A material for forming the protecting layer, preferably, includes silver, aluminum and the like.

To reduce work function of the cathode 15, an oxide, fluoride, metallic compound and the like having a relatively small work function is inserted into the boundary between the cathode 15 and the organic EL layer 14. For example, the cathode 15 is made of aluminum, and lithium fluoride or lithium oxide is inserted into the boundary. The cathode 15 may be formed by a known thin film deposition process, such as vacuum deposition, sputtering, ionization deposition, ion plating and electron beam deposition.

The operation of the organic EL element 11 will now be described.

((Operation))

As the external drive circuit is electrically connected to the anode terminals 132, 132' of the organic EL element 11 and the cathode terminal 152 thereof, a positive hole is transported from the anode terminals 132, 132' to the anode luminescent region 13, while an electron is transported from the cathode terminal 152 to the cathode luminescent region 151.

The positive hole is injected from the anode luminescent region 131 into the organic EL layer 14, while the electron is injected from the cathode luminescent region 151 into the organic EL layer 14. Then, at least one of the positive hole and the electron is transported to the organic EL layer 14 and recombined to generate an excited state, so that the luminescent material achieves an excited state and emits light when returning to a ground state.

Subsequently, the advantageous effect obtained by the organic EL element 11 will now be described.

((Advantageous Effect))

According to the preferred embodiment, the following (1) through (6) advantageous effects are obtained.

(1) Differential between the intensity of electric current flowing at each spot of the organic EL layer 14 is smaller than that of the conventional element. (Part 1)

Since the cathode 15 is enough lower in volume resistivity than the anode 13 in the organic EL element 11, when resistance values of infinitely many electric current paths (the anode terminals 132, 132'—the anode luminescent region 131 —the organic EL layer 14—the cathode luminescent region 151—the cathode terminal 152) are considered, it is enough to only study the anode 13. That is, the resistance value in the cathode 15 may be ignored.

In the organic EL element 11, as a distance of a path traveling through the anode luminescent region 131 is shortened, the resistance value of the path is reduced. Accordingly, electric current flowing near the anode terminal 132 in the organic EL layer 14 is relatively large, while it gets smaller as distanced from the anode terminal 132.

Figures 7A, 7B:
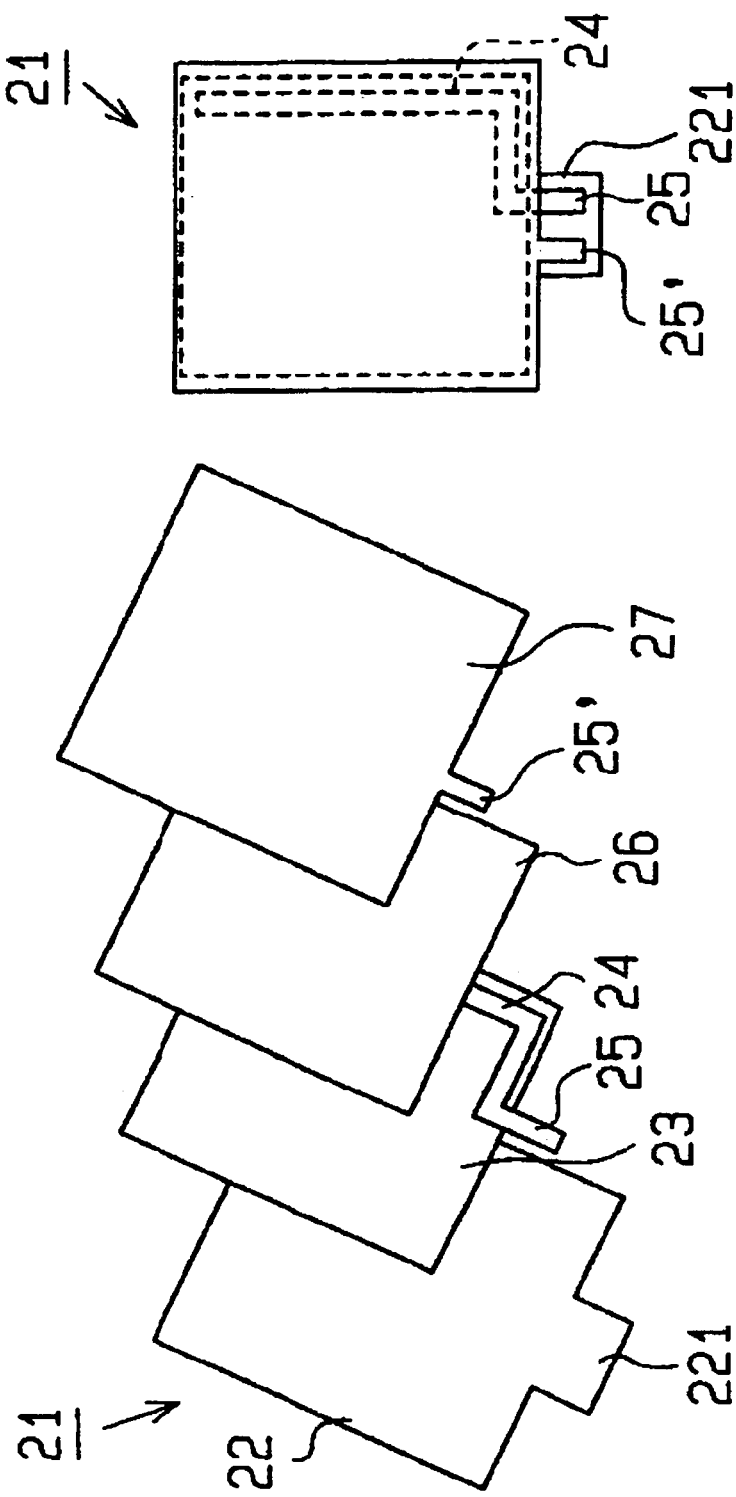
FIG. 7A is a schematically exploded perspective view of an organic EL element according to the prior art.
FIG. 7B is a schematic plan view of the organic EL element according to the prior art.
Figure 8:
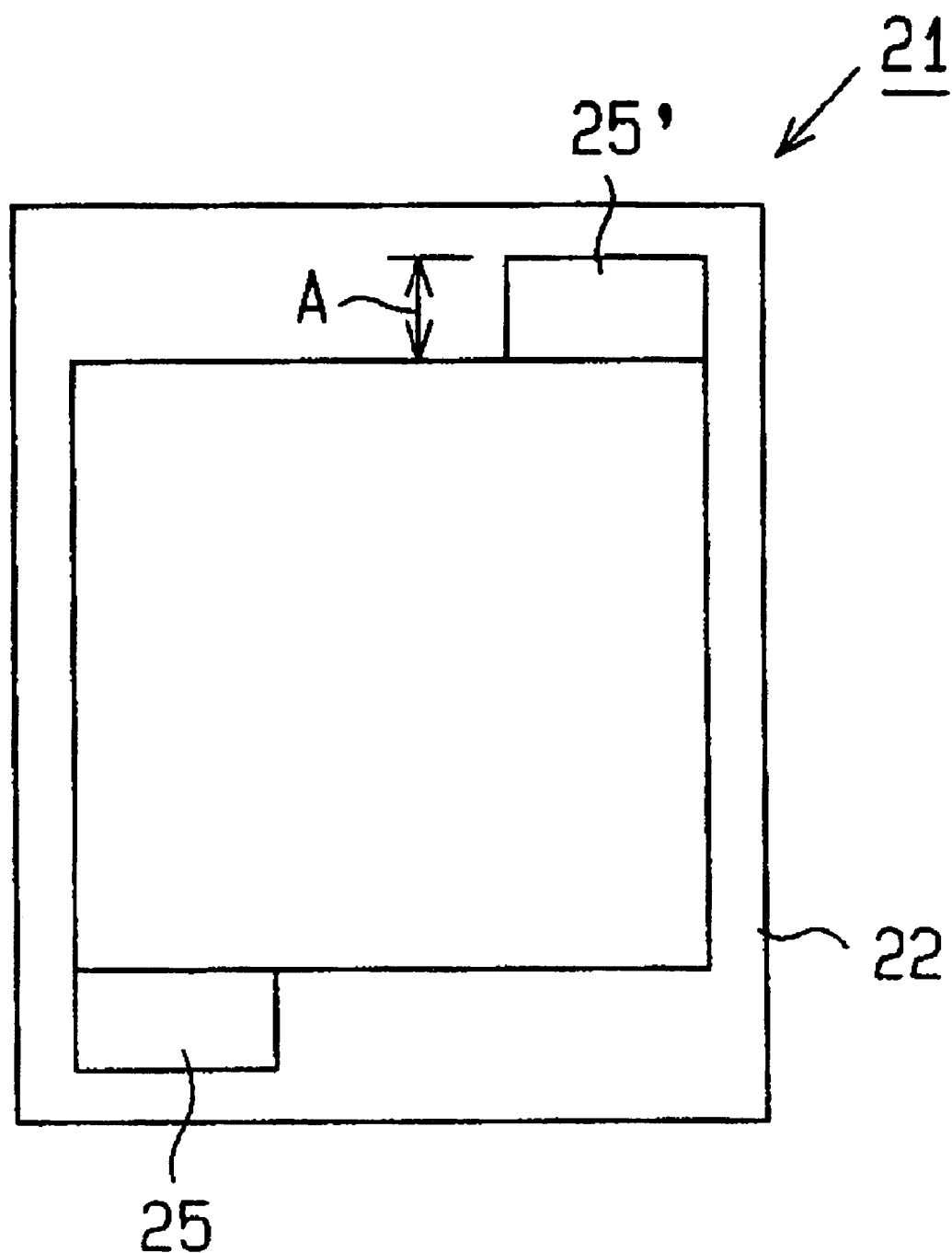
FIG. 8 is a schematic view of another organic EL element according to the prior art.

On the other hand, in the organic EL element 11, the sum of the lengths La1, La2 (or La1+La2) of the respective boundaries 133, 133' between the anode terminals 132, 132' and the anode luminescent region 131 is greater than the length Lc of the boundary 153 between the cathode terminal 152 and the cathode luminescent region 151. Therefore, in comparison to the organic EL element 21 having a short boundary between the anode terminal and the anode luminescent region as shown in FIGS. 7A, 7B and 8, a distance from the terminal to the farthest portion in the luminescent region becomes short in a preferred embodiment. That is, in an electric current path having a greatest resistance value in the element, the organic EL element 11 has a smaller resistance value than the organic EL element 21. An electric current path having a smallest resistance value for both the organic EL element 11 and the conventional element travels through the adjacent anode terminal to the organic EL layer, and its resistance value is regarded as substantially zero.

Accordingly, the organic EL element 11 has a smaller maximum differential in resistance value than the conventional element. Therefore, the differential between the intensity of electric current flowing at each spot of the organic EL layer 14 becomes smaller than that of the conventional element.

Since the length of the boundary between the luminescent region and the terminal in the electrode having a relatively high volume resistivity is greater than that of the electrode having a relatively low volume resistivity, this advantageous effect is obtained. The following advantageous effects (2) and (6) are also obtained by the same reason.

(2) Resistance value of the electrode as a whole may be reduced.

Since the boundary between the luminescent region and the terminal is lengthened in the anode made of a material having a high volume resistivity, resistance value from the anode terminal to the organic EL element as a whole is reduced.

Since the cathode is made of a material having a sufficiently low volume resistivity, even if the boundary between the luminescent region and the terminal is short, the resistance value from the terminal to the organic EL layer as a whole is sufficiently less affected in comparison to the anode. As a result, power loss in the electrode is reduced thereby to improve power efficiency of the organic EL element.

(3) The size of the organic EL element 11 may be reduced.

In the organic EL element 11, the anode terminal 132 and the cathode terminal 152 extend from one side of the respective luminescent regions 131, 151 and the organic EL layer 14. Accordingly, when the size of the luminescent regions 131, 151 are constant, the size of the element is reduced in comparison to the organic EL element in which the terminals do not extend from one side of the luminescent region as shown in FIG. 8. As compared with the organic EL element shown in FIG. 8, the element and the substrate are reduced by one terminal size (the length A in FIG. 8) in the preferred embodiment.

Also, since the terminals 132, 132', 152 extend from one side of the respective luminescent regions 131, 151, the length of wiring is reduced between the external drive circuit and the respective terminals 132, 132', 152 in comparison to the organic EL element in which the terminal do not extend from one side of the luminescent region as shown in FIG. 8.

(4) When the substrate having the same size is employed, the size of the organic EL layer 14 (the size of the luminescent region 131 or 151) may be increased.

Since the terminals 132, 132', 152 extend from one side of the respective luminescent regions 131, 151 in the organic EL element 11, the size of the luminescent regions 131, 151 and the organic EL layer 14 are increased in comparison to the organic EL element in which the terminals do not extend from one side of the luminescent region. That is, the efficient display region may be increased. As compared with the organic EL element shown in FIG. 8, the area of the luminescent regions 131, 151 may be expanded by one terminal size of the element (the length A in FIG. 8).

(5) The organic EL element 11 is easily connected with the external drive circuit.

Since the terminals 132, 132', 152 extend from one side of the respective luminescent regions 131, 151 in the organic EL element 11, connection or wiring the terminals 132, 132', 152 with the external drive circuit may easily be worked in comparison to the element in which the terminals extend from plural sides as shown in FIG. 8. Also, since wiring is just worked on one side of the luminescent regions 131, 151, a connector and the like is provided for connecting the anode terminals 132, 132' and the cathode terminal 152 with the external drive circuit, and wiring work is finished only by plugging the connector and the like to these terminals 132, 132', 152.

(6) Differential between the intensity of electric current flowing at each spot of the organic EL layer 14 is smaller than that of the conventional element. (Part 2)

Since a plurality of the anode terminals 132, 132' is provided in the organic EL element 11, the advantageous effect mentioned in paragraph (1) is further effectively obtained than the element having only one terminal.

The element having a plurality of the terminals extending from one side of the anode luminescent region 131 has a shorter distance from the anode terminal to the farthest portion in the anode luminescent region 131 than the element having only one terminal extending from one side of the anode terminal. Accordingly, the former has a smaller maximum differential of resistance value, so that differential between the intensity of electric current flowing at each spot of the organic EL layer 14 is further reduced.

Since the organic EL element 11 performs the above advantageous effects (1) through (6), it further performs the following advantageous effects (a) through (d).

(a) Control of Unevenness in Brightness

Since the brightness of the organic EL element becomes high as the intensity of electric current increases, when the organic EL element has a portion of relatively large electric current flow and a portion of relatively small electric current flow, brightness differential arises to be unevenness in brightness. On the other hand, the organic EL element 11 reduces differential of resistance value in the electric current path as compared with the conventional element. Accordingly, in the organic EL layer 14, differential of electric current value is reduced between a portion of relatively large electric current flow and a portion of relatively small electric current flow. Therefore, the organic EL element as a whole reduces its unevenness in brightness.

(b) Extension of Life of Element

Generally, a portion of relatively large electric current flow has a shorter life. On the other hand, the organic EL element 11 reduces differential of electric current value between a portion of relatively large electric current flow and a portion of relatively small electric current flow as compared with the conventional element. Therefore, differential of life is reduced between a portion of relatively long life of the element and a portion of relatively short life of the element due to the intensity of electric current flow.

(c) Prevention of Degradation of Element

The organic EL element 11 reduces differential of electric current value between a portion of relatively large electric current flow and a portion of relatively small electric current flow in the organic EL layer 14 as compared with the conventional element. Therefore, differential of degree of degradation may be reduced between a relatively degradable portion in the element and a relatively non-degradable portion in the element due to the intensity of electric current flow.

(d) Control of Unevenness in Chromaticity

Unevenness in chromaticity is controlled in the organic EL element to emit light of a plurality of wavelengths from a plurality of luminescent materials in the organic EL layer. For example, emitting white light by layering a red luminescent layer, a blue luminescent layer and a green luminescent layer. In such an organic EL element, as the intensity of electric current flowing in the organic EL layer varies, brightness of each luminescent material varies, that is, luminescent color (chromaticity) of the element varies (S-S annihilation phenomenon, T-T annihilation phenomenon).

However, the organic EL element 11 may reduce differential of electric current value between a portion of relatively large electric current flow and a portion of relatively small electric current flow in the organic EL layer 14. Accordingly, the above phenomena are controlled thereby to control unevenness in chromaticity.

((Alternative Embodiments))

The organic EL element 11 may be modified into the following alternative embodiments. Also, each alternative embodiment may be combined with each other as far as it does not contradict each other.

(First Alternative Embodiment)

The length La1 of the boundary 133 between the anode terminal 132 and the anode luminescent region 131 may be different from the length La2 of the boundary between the anode terminal 132' and the anode luminescent region 131. That is, the organic EL element 11 has a greater total length of boundaries between the anode terminal and the anode luminescent region than the total length of boundary between the cathode terminal and the cathode luminescent region.

Likewise, even if the length La1 of the boundary 133 between the anode terminal 132 and the anode luminescent region 131 is different from the length Lc of the boundary 153 between the cathode terminal 152 and the cathode luminescent region 151, the organic EL element 11 has only to meet the above requirement. That is, the length of the boundary between the luminescent region and the terminal in an electrode having a relatively high volume resistivity is greater than the length of the boundary between the luminescent region and the terminal in an electrode having a relatively low volume resistivity.

(Second Alternative Embodiment)

The shape of the anode terminal 132 and the cathode terminal 152 are not limited to rectangle. As far as at least the portions respectively contacting the luminescent regions are substantially straight lines, any shapes are applicable. It is noted that the substantially straight line means line (or side) which is substantially regarded as a line even if it partially has curve or it is curve as a whole. Accordingly, even if total area of the anode terminal 132 is smaller than that of the cathode terminal 152, the organic EL element 11 has only to meet the above requirement.

(Third Alternative Embodiment)

The anode luminescent region 131 and the cathode luminescent region 151 are not limited to strict rectangles. For example, corner-chamfered rectangles, corner-rounded rectangles and the like are applicable. It is noted that as the corner of the luminescent region is chamfered or rounded, concentration of power on the corner is reduced.

(Fourth Alternative Embodiment)

The anode luminescent region 131 and the cathode luminescent region 151 are not limited to a rectangular shape. Portions (or sides) from which the terminals extend are at least substantially straight lines in shape, and these portions (or sides) substantially correspond with each other through the organic EL layer 14. It is noted that the substantially corresponding portions are located at substantially symmetric positions relative to a plane expanding along a middle of the through-thickness direction of the organic EL layer 14.

(Fifth Alternative Embodiment)

The cathode luminescent region 151 may be made smaller than the anode luminescent region 131. Thus, as the size of the electrode luminescent region layered later is reduced, a short circuit between the electrodes hardly occurs.

(Sixth Alternative Embodiment)

An insulating layer is provided around the organic EL layer 14 thereby to prevent short circuits between the anode luminescent region 131 and the cathode luminescent region 151. For example, the anode luminescent region 131 is at first formed and the organic EL layer 14 is subsequently formed on the anode luminescent region 131, after that the insulating layer is formed around the organic EL layer 14, preferably so as not to expose the anode luminescent region 131 in this manufacturing process, and then the cathode luminescent region 151 is formed. After the anode luminescent region 131 is formed, the insulating layer is formed to cover the circumference of the anode luminescent region 131, and then the organic EL layer 14 and the cathode luminescent region 151 are formed.

A material for forming the insulating layer may appropriately employ a material of the insulating layer applied to a known organic EL element. The material includes $SiO_2$, $SiON$, $Al_2O_3$, $Si_3N_4$, $SiAlON$, $Y_2O_3$, $BaTiO_3$, $Sm_2O_3$, $BaTa_2O_6$, $Ta_2O_5$, $ATO$, $Al_2O_3$—$TiO_2$, $SrTiO_3$, $PbTiO_3$ and the like. The forming process may also employ a known forming process, such as sputtering, electron beam deposition, chemical vapor deposition ("CVD") and the like.

(Seventh Alternative Embodiment)

Figure 3A:
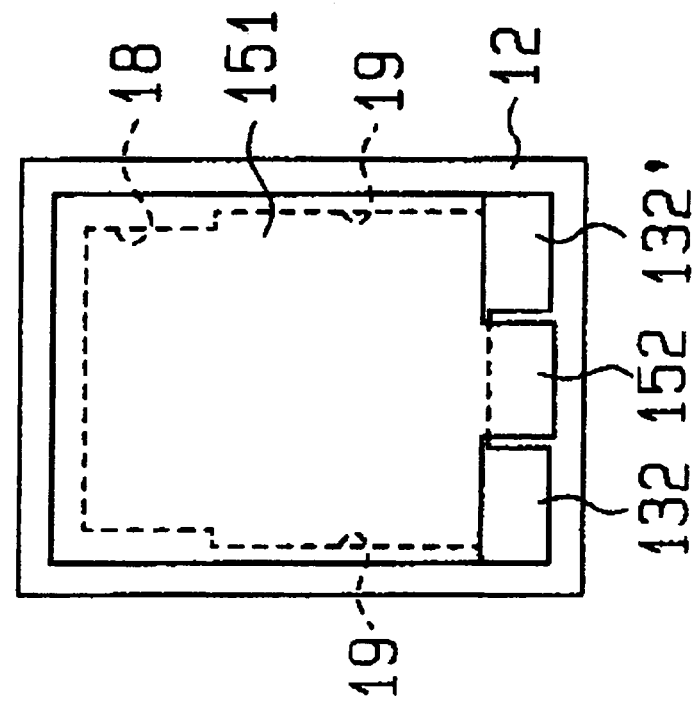
FIG. 3A is a schematic plan view of an organic EL element according to an alternative embodiment of the present invention.
Figure 3B:
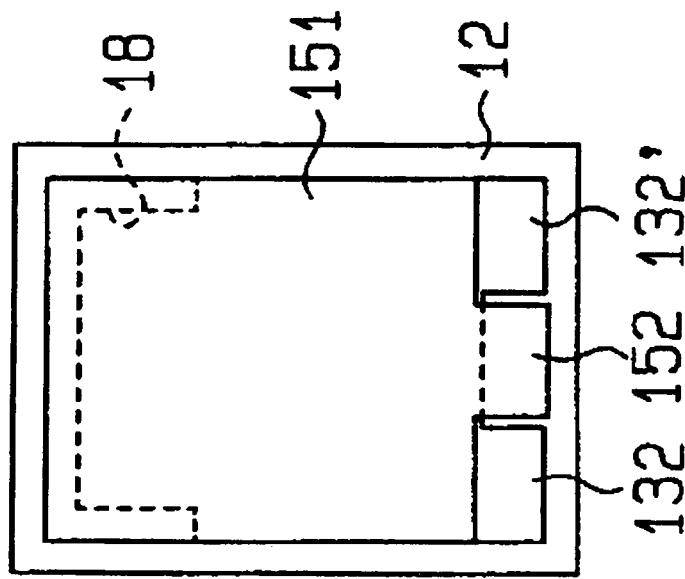
FIG. 3B is a schematic plan view of the organic EL element according to an alternative embodiment of the present invention.

As shown in FIGS. 3A and 3B, a sub-electrode is provided and electrically connected to the anode luminescent region 131.

As shown in FIG. 3A, when a sub-electrode 18 is arranged on the opposite side from the side from which the anode terminal 132 extends in the anode luminescent region 131, the volume resistivity of the anode adjacent to the sub-electrode 18 reduces as a whole, so that electric current tends to flow into these portions in the organic EL layer 14. Accordingly, the above advantageous effects are obtained.

As shown in FIG. 3B, when the sub-electrodes 18, 19 are provided and electrically connected to the anode terminals 132, 132', the electric potential of the anode luminescent region 131 adjacent to the sub-electrodes 18, 19 approaches the electric potential of the anode terminals 132, 132' thereby to obtain the above advantageous effects.

The sub-electrode is made of a material having a lower volume resistivity than the anode 13 and is formed by a known process for forming a sub-electrode. A material for forming the sub-electrode, for example, includes chromium, silver, silver based alloy, copper, aluminum, aluminum based alloy, nickel, nickel based alloy, molybdenum, tungsten, gold and the like.

(Eighth Alternative Embodiment)

Figure 4A:
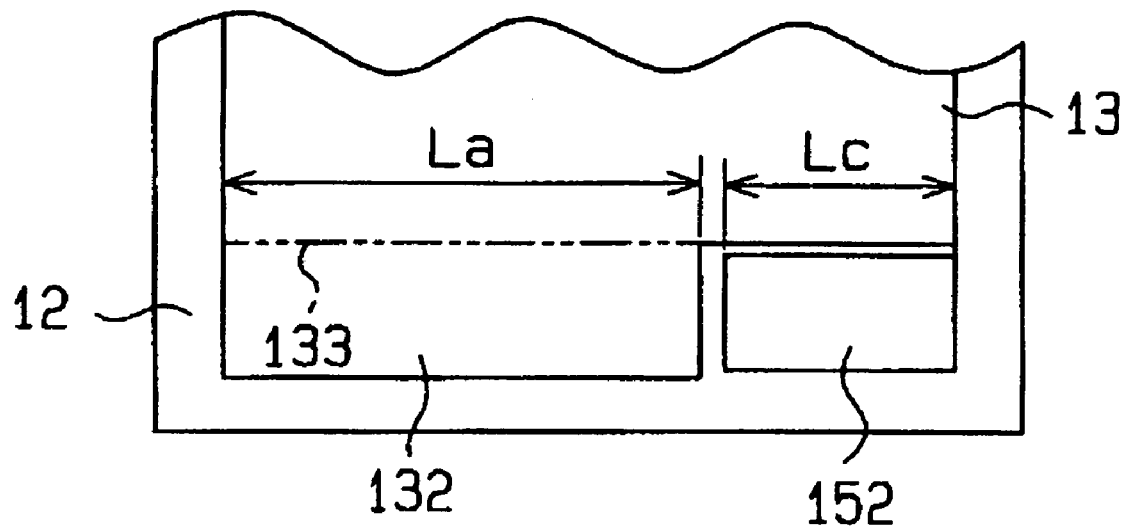
FIG. 4A is a schematic plan view illustrating relationships between a first terminal portion, a first electrode and a second terminal portion according to an alternative embodiment of the present invention.

Only one anode terminal 132 may be provided. Even in this case, as shown in FIG. 4A, when the length La1 of the boundary 133 between the anode terminal 132 and the anode luminescent region 131 is greater than the length Lc of the boundary 153 between the cathode terminal 152 and the cathode luminescent region 151, the above advantageous effects (1) through (5) and (a) through (d) are obtained.

(Ninth Alternative Embodiment)

Figure 4B:
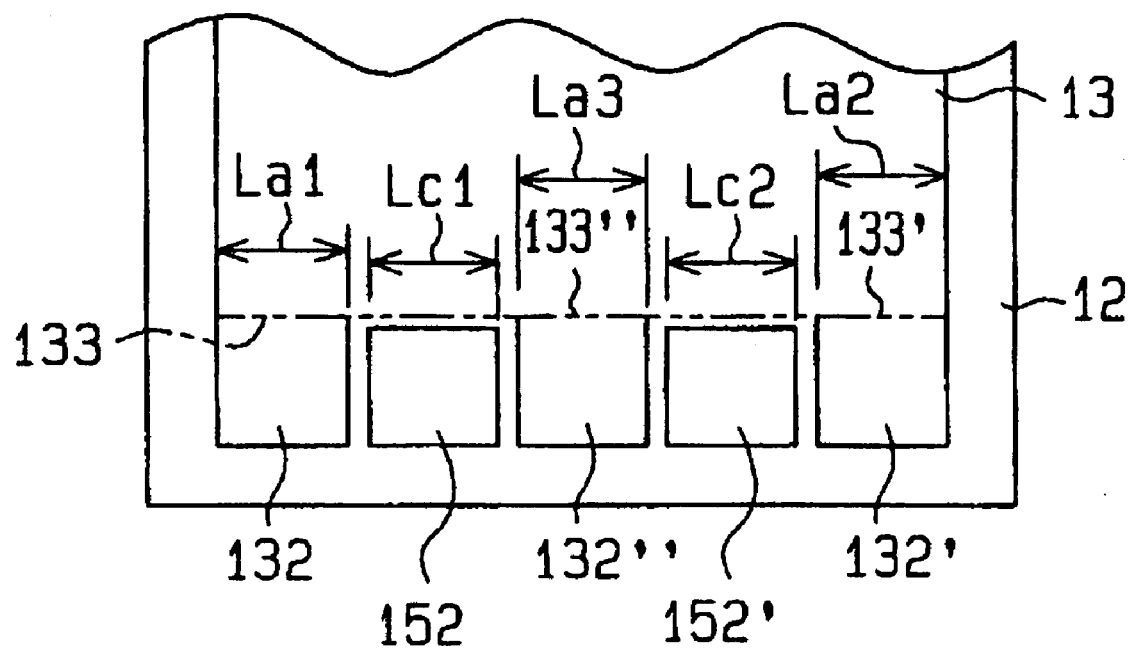
FIG. 4B is a schematic plan view illustrating relationships between a first terminal portion, a first electrode and a second terminal portion according to an alternative embodiment of the present invention.

Three or more anode terminals may be provided, and two or more cathode terminals may be provided. For example, as shown in FIG. 4B, three anode terminals 132, 132', 132" are provided, and two cathode terminals 152, 152' are provided. In this case, when the sum of the lengths La1, La2, La3 (or La1 +La2+La3) of the respective boundaries 133, 133', 133" between the anode terminals 132, 132', 132" and the anode luminescent region 131 is greater than the sum of the lengths Lc1, Lc2 (or Lc1+Lc2) of the boundaries 153, 153' between the cathode terminals 152, 152' and the cathode luminescent region 151, the above advantageous effects (1) through (5) and (a) through (d) are obtained. Furthermore, as shown in FIG. 4B, the anode terminals 132, 132', 132" and the cathode terminals 152, 152' are alternately provided, or the anode terminals 132, 132" are arranged on each outermost end, the above advantageous effect (6) is further obtained.

(Tenth Alternative Embodiment)

In order to protect the organic EL layer 14 and the like from ambient air, the organic EL element 11 may be protected by a passivation film or a sealing can. Then, the organic EL element 11 needs to be protected so as to expose the anode terminals 132, 132', 132" and the cathode terminals 152, 152' outside the element 11. The passivation film is a protecting layer (a sealing layer) provided on the opposite side from the substrate 12 for preventing the organic EL element 11 from contacting with oxygen and moisture. A material for a passivation film includes organic polymeric material, inorganic material, photo-setting resin and the like. A material for the protecting layer may be single or plural. The protecting layer may be a single-layered structure or may be a multi-layered structure. The passivation film has enough thickness to block moisture and gas from outside.

The organic polymeric material, for example, includes fluororesin, acrylic resin, epoxy resin, silicon resin, epoxysilicone resin, polystyrene resin, polyester resin, polycarbonate resin, polyamide resin, polyimide resin, polyamideimide resin, polyparaxylene resin, polyethylene resin, polyphenylene oxide resin and the like. The fluororesin includes chlorotrifluoroethylene polymer, dichlorodifluoroethylene polymer, copolymer of chlorotrifluoroethylene polymer and dichlorodifluoroethylene polymer and the like. The acrylic resin includes polymethyl methacrylate, polyacrylate and the like.

The inorganic material includes polysilazane, diamond thin film, amorphous silica, electrical insulation glass, metal oxide, metal nitride, metal carbide, metal sulfide and the like.

The sealing can is constituted of a sealing member, such as a sealing plate and a sealing casing, and is provided on the opposite side from the substrate 12 for blocking moisture and oxygen from outside. The sealing casing may be provided only on the electrode side of the backside (the opposite side from the substrate 12) or may cover the whole organic EL element 11. The shape, size and thickness of the sealing member are not limited as far as the sealing member seals the organic EL element 11 and blocks ambient air. A material for the sealing member includes glass, stainless steel, metal (aluminum and the like), plastics (polychlorotrifluoroethylene, polyester, polycarbonate and the like), ceramics and the like.

When the sealing member is attached to the organic EL element 11, a sealing compound (adhesive) may appropriately be used. When the whole organic EL element 11 is covered with the sealing member, the sealing members may be bonded by a heat seal without a sealing compound. The sealing compound includes ultraviolet ray cured resin, thermoset resin, two-component cured resin and the like.

It is noted that a moisture absorbent may be inserted into a space between the passivation film or the sealing can and organic EL element 11. The moisture absorbent is not limited but, for example, includes barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, magnesium oxide and the like.

Inactive gas may be encapsulated into the passivation film and the sealing can. The inactive gas means gas which does not react with the organic EL element 11 and includes noble gases, such as helium and argon, and nitrogen gas.

(Eleventh Alternative Embodiment)

The above described embodiments disclose an example of the integrated anode 13. However, each component of the anode 13 may be separately manufactured and assembled thereby to form the anode 13. Likewise, each component of the cathode 15 may be separately manufactured.

(Twelfth Alternative Embodiment)

The organic EL element 11 may not emit light from its whole region but may be arranged as a plurality of the organic EL elements 11 in a matrix. In this case, the organic EL element displays an image by a passive matrix control method or an active matrix control method.

(Thirteenth Alternative Embodiment)

The above embodiments disclose an example of the anode made of a material having a higher volume resistivity than the cathode. However, when the cathode has a higher volume resistivity than the anode, the cathode may be treated as described above.

The above embodiments disclose an example of the electrode adjacent to the substrate made of a material having a higher volume resistivity than the other electrode. However, when the other electrode has a higher volume resistivity than the electrode adjacent to the substrate, the other electrode may be treated as described above.

(Fourteenth Alternative Embodiment)

The anode terminal 132 and the cathode terminal 152 may be layered by interposing therebetween an insulating layer. Thus, the boundary 133 between the anode terminal 132 and the anode luminescent region 131 may be made longer thereby to obtain the above advantageous effects.

Figure 5:
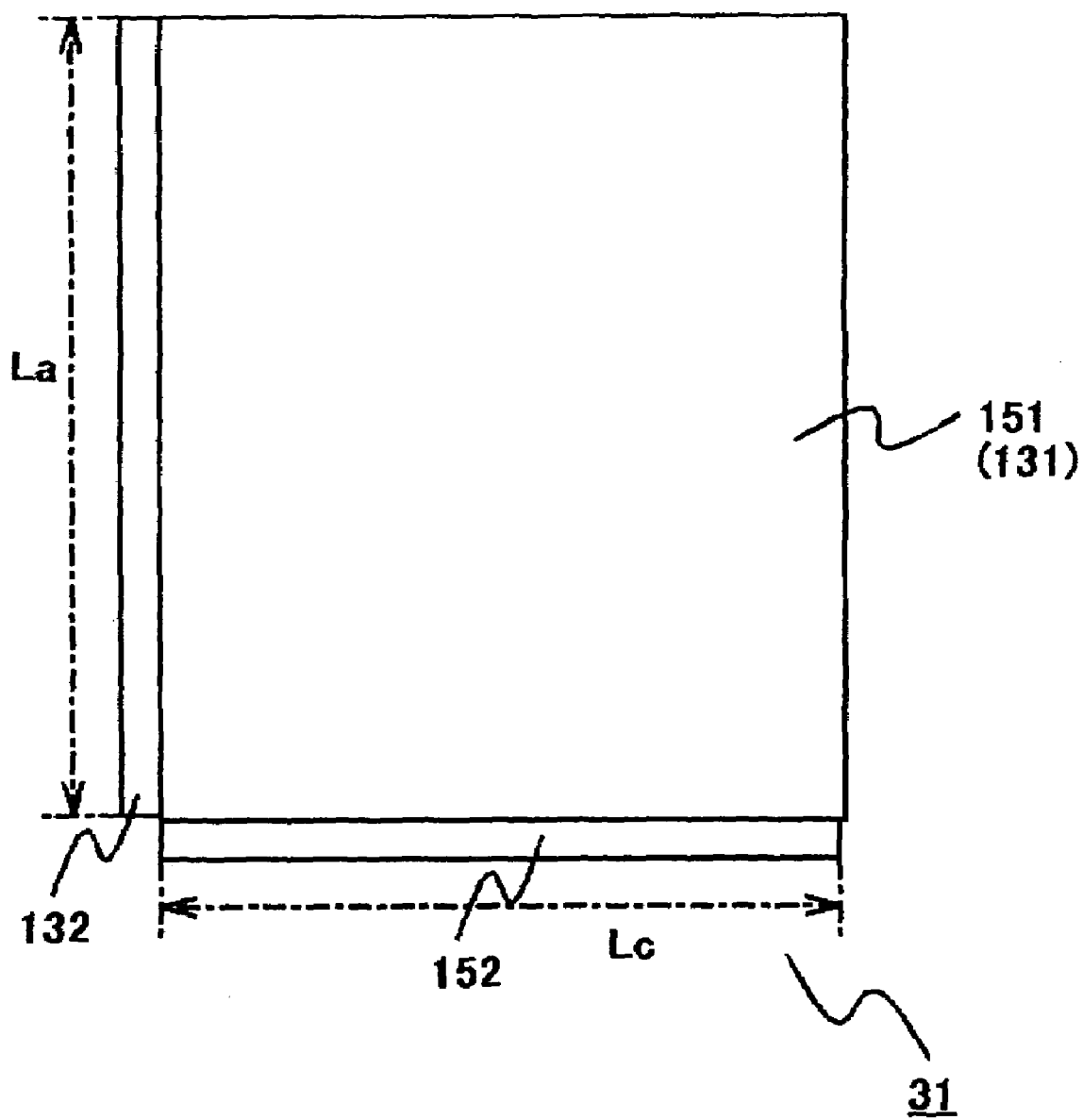
FIG. 5 is a schematic plan view of a second organic EL element according to another embodiment of the present invention.
Figure 6:
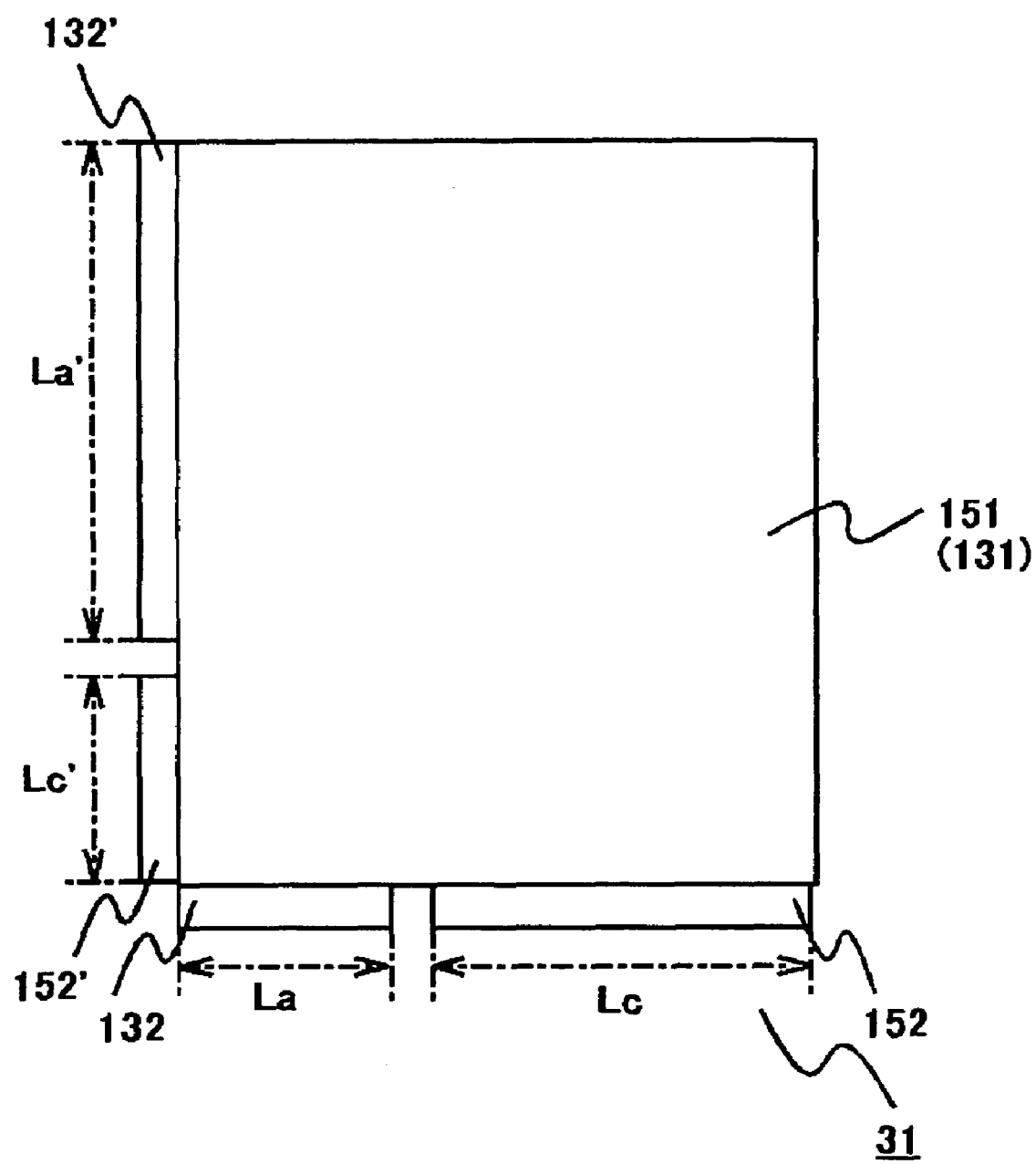
FIG. 6 is a schematic plan view of another second organic EL element according to another preferred embodiment of the present invention.

A second organic electroluminescent element or a second organic EL element 31 will now be described with reference to FIGS. 5 and 6. FIG. 5 is a schematic plan view of the second organic EL element 31. FIG. 6 is a schematic plan view of the second organic EL element 31 according to another embodiment of the present invention. It is noted that the same reference numerals in FIGS. 5 and 6 denote the substantially identical components to those in FIGS. 1 through 4B, 7 and 8.

[Second Organic EL Element 31]

The second organic EL element 31 includes an anode or a first and transparent electrode, a cathode or a second electrode, and an organic electroluminescent layer or an organic EL layer sandwiched by both electrodes. Each electrode is formed as follows.

The anode is made of a material having a higher volume resistivity than the cathode.

As shown in FIG. 5, the anode includes the anode luminescent region 131 which connects with the organic EL layer and the anode terminal 132 extending from the anode luminescent region 131.

As shown in FIG. 5, the cathode includes the cathode luminescent region 151 which connects with the organic EL layer and the cathode terminal 152 extending from the cathode luminescent region 151.

As shown in FIG. 5, the anode terminal 132 and the cathode terminal 152 are not provided on the corresponding sides of the substantially rectangular luminescent regions, that is, the anode terminal 131 and the cathode terminal 151 do not extend from the corresponding sides, which is different from the first organic EL element 11. The anode terminal 132 extends from a side of the anode luminescent region 131 (on the left side of the anode luminescent region 131 in FIG. 5), while the cathode terminal 152 extends from a side of the cathode luminescent region 151 (on the lower side of the cathode luminescent region 151 in FIG. 5). That is, the side from which the anode terminal 132 extends is next to the side from which the cathode terminal 152 extends.

The second organic EL element 31 emits light by the same mechanism of the first organic EL element 11. Also, as well as the first organic EL element 11, since the length La of the boundary between the luminescent region 131 and the terminal 132 of the electrode having a high volume resistivity is greater than the length Lc of the boundary between the luminescent region 151 and the terminal 152 of the electrode having a low volume resistivity, the same advantageous effects mentioned in the paragraphs (1), (2), (6) and (a) through (d) are obtained.

It is noted that the second organic EL element 31 may be modified as well as the first organic EL element 11 unless it goes against the main object. Also, a structure applied to a known organic EL element may be selected.

For example, the anode terminal and the cathode terminal may be plurally provided, respectively. In this case, the sum of the lengths of the boundaries between the respective anode terminals and the anode luminescent regions is greater than the sum of the lengths of the boundaries between the respective cathode terminals and the cathode luminescent regions. As shown in FIG. 6, the anode luminescent region 131 and the cathode luminescent region 151 each has paired sides on the outer periphery thereof (the left side and the lower side of the respective luminescent regions 131, 151 in FIG. 6). Each paired sides is next to each other. The paired sides of the anode luminescent region 131 and the cathode luminescent region 151 correspond with each other. The two anode terminals 132, 132' and the two cathode terminals 152, 152' respectively extend from each paired sides. The sum of the lengths La1, La2 (or La1+La2) of the boundaries between the anode terminals 132, 132' and the anode luminescent region 131 is made greater than the sum of the lengths Lc1, Lc2 (or Lc1+Lc2) of the boundaries between the cathode terminals 152, 152' and the cathode luminescent region 151.

Furthermore, the boundary between the luminescent region and the terminal is not limited to be a substantially straight line.

The technical idea in connection with the second organic EL element 31 may be applied to the organic EL element including the cathode having a higher volume resistivity than the anode.

Therefore, the present examples and embodiments are to be considered as illustrative and not restrictive, and the invention is not to be limited to the details given herein but may be modified within the scope of the appended claims.

What is claimed is:

1. An organic electroluminescent element comprising:
   a first electrode having a first luminescent region and a first terminal extending from the first luminescent region;
   a second electrode having a second luminescent region and a second terminal extending from the second luminescent region, the first electrode being made of a material having a higher volume resistivity than the second electrode; and
   an organic electroluminescent layer interposed between the first electrode and the second electrode, wherein the first luminescent region and the second luminescent region respectively contact the organic electroluminescent layer, a length of a boundary between the first luminescent region and the first terminal being greater than a length of a boundary between the second luminescent region and the second terminal.

2. The organic electroluminescent element according to claim 1, wherein the first luminescent region and the second luminescent region each has a side of a substantially straight line on a periphery thereof, the side of the first luminescent region substantially corresponding with the side of the second luminescent region through the organic electroluminescent layer, the first terminal and the second terminal each extending from the respective corresponding sides.

3. The organic electroluminescent element according to claim 2, wherein the first luminescent region and the second luminescent region are respectively rectangular in shape.

4. The organic electroluminescent element according to claim 2, wherein the first terminal and the second terminal are alternately arranged on the respective corresponding sides of the first and second luminescent regions.

5. The organic electroluminescent element according to claim 4, wherein the first terminal is arranged on each end of the side of the first luminescent region.

6. The organic electroluminescent element according to claim 1, wherein the first electrode is an anode.

7. The organic electroluminescent element according to claim 1, further comprising:
   a sub-electrode provided on the first electrode.

8. The organic electroluminescent element according to claim 7, wherein the sub-electrode is made of a material having a lower volume resistivity than the first electrode.

9. The organic electroluminescent element according to claim 7, wherein the sub-electrode is at least arranged on an opposite side from the side from which the first terminal extends.

10. The organic electroluminescent element according to claim 9, wherein the sub-electrode is electrically connected to the first electrode.

11. The organic electroluminescent element according to claim 1, wherein the first luminescent region and the second luminescent region each has a side on an outer periphery thereof, the side of the first luminescent region from which the first terminal extends being next to the side of the second luminescent region from which the second terminal extends.

12. The organic electroluminescent element according to claim 1, wherein the first terminal and the second terminal are plurally formed, respectively.

13. The organic electroluminescent element according to claim 12, wherein the first luminescent region and the second luminescent region each has paired sides on a periphery thereof, each paired sides being next to each other, the paired sides of the first luminescent region and the second luminescent region corresponding with each other, the first terminals and the second terminals respectively extending from each paired sides.

* * * * *